United States Patent
Shen et al.

(10) Patent No.: US 6,365,328 B1
(45) Date of Patent: Apr. 2, 2002

(54) SEMICONDUCTOR STRUCTURE AND MANUFACTURING METHOD

(75) Inventors: Hua Shen, Beacon, NY (US); David Kotecki, Orono, ME (US); Satish Athavale, Fishkill, NY (US); Jenny Lian, Wallkill, NY (US); Laertis Economikos; Fen F. Jamin, both of Wappingers Falls, NY (US); Gerhard Kunkel, Fishkill, NY (US); Nirmal Chaudhary, Poughkeepsie, NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/522,883

(22) Filed: Mar. 10, 2000

(51) Int. Cl.$^7$ .................................................. G03F 7/00
(52) U.S. Cl. ........................ 430/313; 430/314; 430/316; 430/317; 430/318; 430/319; 438/253; 438/396
(58) Field of Search ................................. 430/313, 314, 430/316, 317, 318, 319, 253; 438/396

(56) References Cited

U.S. PATENT DOCUMENTS

| | | | |
|---|---|---|---|
| 6,066,528 A | * | 5/2000 | Fazan et al. ................ 438/253 |
| 6,177,351 B1 | * | 1/2001 | Beratan et al. ............. 438/694 |
| 6,180,970 B1 | * | 1/2001 | Hwang et al. .............. 257/295 |
| 6,222,220 B1 | * | 4/2001 | Lin et al. ................... 257/306 |

* cited by examiner

*Primary Examiner*—Mark F. Huff
*Assistant Examiner*—Nicole Barreca

(57) ABSTRACT

A method for forming an electrode. The method includes forming a conductive plug through a first dielectric layer. The plug extends from an upper surface of the first dielectric layer to a contact region in a semiconductor substrate. The electrode is formed photolithographically, misalignment of a mask registration in the photolithography resulting in exposing surface portions of the barrier contact. A second dielectric layer is deposited over the first dielectric layer, over side portions and top portions of the formed electrode, and over the exposed portions of barrier contact. A sacrificial material is provided on portions of the second dielectric layer disposed on lower sides of the, electrode, on portions of the second dielectric layer disposed on the first dielectric layer, and on said exposed portions of the barrier contact while exposing portions of the second dielectric layer on the top portions and upper side portions of the formed electrode. The exposed portions of the second dielectric layer are removed while leaving the portions of the second dielectric layer on the exposed portions of the barrier contact. A material is deposited over exposed portions of the first electrode and over remaining portions of the second dielectric layer in an oxidizing environment. A second electrode is formed for the storage element over the material. In forming a capacitor storage element, the portion of the second dielectric layer on the barrier contact prevents oxidation of the barrier contact during the material formation process.

7 Claims, 4 Drawing Sheets

SEMICONDUCTOR STRUCTURE AND MANUFACTURING METHOD

BACKGROUND OF THE INVENTION

This invention relates generally to semiconductor structures and manufacturing methods and more particularly to semiconductor memory devices.

As is known in the art, semiconductor memories have a wide range of applications. One type of such memory device is a random access memory (RAM). One type of such RAM includes a storage element electrically connected to a transistor, e.g. a Dynamic Random Access Memory, or DRAM). When the transistor is enabled during a write operation, data may be stored in the storage element while, during a subsequent read operation the data stored in the storage element may be read therefrom. The storage element may be, for example, a capacitor having a pair of plates, or electrodes separated by a dielectric. With such storage element, when a logic one is to be written into the storage element, the transistor is enabled to couple charge to the plates whereas when a logic zero is to be written into the storage element charge the transistor is enabled to removed from the plates. Another type of storage element is a ferroelectric device, a so-called Ferroelectric Random Access Memory (FRAM). Such device includes a ferroelectric material disposed between a pair of electrodes. Typically, when a logic one is to be written into this type of storage element the transistor is enabled to couple a voltage to the plates and thereby produce an electric field (which is a vector) through the ferroelectric material in a first direction (i.e., in a direction from say a first one of the plates, which is placed at a positive potential relative to the second one of the plates, to the second one of the plates). Even when the voltage is removed, the ferroelectric material "remembers" the direction of the electric field. On the other hand, when a logic zero is to be written into this type of storage element the transistor is enabled to produce an electric field through the ferroelectric material in a second direction opposite to the first direction (i.e., in a direction from say the second one of the plates, which is placed now at a positive potential relative to the first one of the plates, to the first one of the plates). The state of the bit is detected by, for example, sensing the "direction" of the electric filed stored by the ferroelectric material.

With both these, and other types of memory devices, is generally necessary to electrically connect one of the electrodes of the storage element to a region in a semiconductor substrate, for example to a doped region in the substrate providing a source/drain region of the transistor in the case of a MOSFET device. With many of these devices the storage element is formed over the substrate in a so-called stack arrangement.

SUMMARY OF THE INVENTION

In accordance with the present invention, a method is provided for forming an electrode. The method includes forming a conductive plug through a first dielectric layer. The plug extends from an upper surface of the first dielectric layer to a contact region in a semiconductor substrate. A barrier contact is formed on an upper surface of the conductive plug. The electrode is formed on one portion of the upper surface of the barrier contact, another portion of the is upper surface of the barrier contact being uncovered by the electrode. A second dielectric layer is deposited over the first dielectric layer, over side portions and top portions of the formed electrode, and over the uncovered portion of barrier contact. A sacrificial material is formed on portions of the second dielectric layer disposed on: lower sides of the electrode; portions of the second dielectric layer disposed on the first dielectric layer; and, said exposed portions of the barrier contact while exposing portions of the second dielectric layer disposed on the top portions and upper side portions of the formed electrode. The exposed portions of the second dielectric layer are removed while leaving the portions of the second dielectric layer disposed on: lower sides of the electrode; portions of the second dielectric layer disposed on the first dielectric layer; and, portions of the second dielectric layer disposed on said exposed portions of the barrier contact.

In accordance with one embodiment of the invention, a method is provided for forming a storage element. The method includes forming a conductive plug through a first dielectric layer. The plug extends from an upper surface of the first dielectric layer to a contact region in a semiconductor substrate. A barrier contact is formed on an upper surface of the conductive plug. A first electrode for the storage element is formed on one portion of the upper surface of the barrier contact, another portion of the upper surface of the barrier contact being uncovered by the first electrode. A second dielectric layer is formed over the first dielectric layer, over side portions and top portions of the formed first electrode, and over the uncovered portion of barrier contact. A sacrificial material is formed on portions of the second dielectric layer disposed on: lower sides of the electrode; portions of the second dielectric layer disposed on the first dieletric layer; and, said exposed portions of the barrier contact while exposing portions of the second dielectric layer disposed on the top portions and upper side portions of the formed first electrode. The exposed portions of the second dielectric layer are removed while leaving the portions of the second dielectric layer disposed on: lower sides of the first electrode; portions of the second dielectric layer disposed on the first dielectric layer; and, portions of the second dielectric layer disposed on said exposed portions of the barrier contact. A material is deposited over exposed portions of the first electrode and over remaining portions of the second dielectric layer in an oxidizing environment. A second electrode is formed for the storage element over the formed material.

In one embodiment of the invention, the material is formed in an oxidizing environment to provide a capacitor storage element. The portion of the second dielectric layer on the barrier contact prevents oxidation of the barrier contact during the formation of the material in the oxidizing environment.

In accordance with one embodiment of the invention the first electrode is formed photolithographically with misalignment of a mask registration in the photolithography resulting in exposing surface portions of the barrier contact.

In accordance with still another embodiment of the invention, method is provided for forming an electrode in contact with a semiconductor substrate. The method includes forming a first dielectric layer on a surface of the substrate. A mask is provided over the first dielectric layer. The mask has a window over a selected portion of the surface of the substrate to expose an underlying portion of the first dielectric. The underlying portion of the dielectric layer is selectively removed to form a via through such first dielectric layer. The via exposes an underlying portion of the surface of the substrate. The mask is removed to expose the first dielectric layer and the via formed therein. An electrically conductive material is deposited over exposed first dielectric layer and through the via onto the exposed portion of the substrate. The upper portions of the conductive material are removed forming an upper surface of such material co-planar with the surface of the first dielectric layer. Portions of such conductive material pass through the via from the surface of the first dielectric layer to said exposed portion of substrate to provide a conductive plug through the first dielectric layer. An upper portion of the conductive plug is removed to provide a recess. The recess has portions of the dielectric layer providing sidewalls of the recess and an upper surface of the conductive plug providing a bottom of the recess. A barrier conductive layer is formed over the first dielectric layer with portions of the barrier conductive layer being disposed in the recess. Upper portions of the barrier conductive layer are removed to form a barrier conductive contact in the recess. The contact extends from the conductive plug and terminates in a plane of the dielectric layer. An electrode layer is depositing over the first dielectric layer and over the barrier conductive contact. A mask is formed over the electrode layer. The mask is nominally in registration with the barrier conductive contact. Unmasked portions of the electrode layer are removed while leaving the portions of the electrode layer under the mask to provide the electrode. Misalignment of the mask registration results in exposing portions of the barrier conductive contact. The mask is removed. A second dielectric layer is deposited over the first dielectric layer and over side portions and top portions of the formed electrode and over any exposed portions of barrier conductive contact. A sacrificial material is deposited over the second dielectric layer, such sacrificial material extending above the top portions of the formed electrode. Upper portions of the sacrificial material are removed to expose portions of the second dielectric layer disposed on said tops of the formed electrode and on upper portions of said sides of the formed electrode while leaving lower portions thereof on portions of the second dielectric layer disposed on lower sides of the electrode, on portions of the second dielectric layer disposed on the first dielectric layer, and on any portions of the second dielectric layer disposed on any of said exposed portions of the barrier conductive contact. The exposed portions of the second dielectric layer are removed while leaving the portions of the second dielectric layer disposed on lower sides of the electrode, on portions of the second dielectric layer disposed on the first dielectric layer, and on any portions of the second dielectric layer disposed on any of said exposed portions of the barrier conductive contact.

In accordance with another embodiment of the invention a storage element is provided. The element includes a first dielectric having a conductive plug passing therethrough. A barrier contact is disposed on the conductive plug and within a recess having portions of the first dielectric as sidewalls of such recess. An electrode for the storage element disposed on only a portion of the barrier contact. A second dielectric layer disposed on other portions of the barrier contact and on lower sidewall portions of the electrode, upper side portions and top portions of the electrode being uncovered by the second dielectric layer.

BRIEF DESCRIPTION OF THE DRAWING

These and other features of the invention, as well as the invention itself, will become more readily apparent from the following detailed description when read together with the accompanying drawings, in which.

DESCRIPTION OF THE PREFERRED EMBODIMENTS

Figure 1:
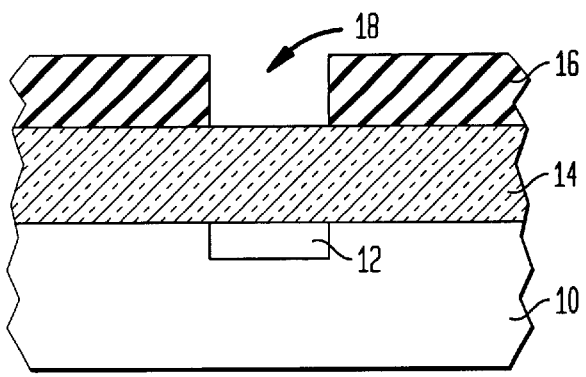
FIGS. 1 through 14 are diagrammatical cross-sectional sketches of storage element at various stages in the fabrication thereof.

Referring now to FIG. 1, a semiconductor substrate 10 is provided.

The substrate 10 has a doped region 12 formed therein. Here such doped region is the source or drain region of a transistor, such transistor being a part of a DRAM cell being formed in a manner to be described. After forming the doped region, along with a source region, not shown, and a gate, not shown, for the transistor, not shown, a dielectric layer 14, here deposited silicon dioxide is formed over the upper surface of the substrate including the doped region 12, as shown.

Next, a photoresist layer 16 is deposited over the dielectric layer 14. The mask is then lithographically patterned with a window 18 therein, as shown, such window 18 being disposed over a selected portion of the surface of the substrate 10 to expose an underlying portion of the dielectric layer 16. More particularly, the window 18 is disposed over the doped region 12, as indicated.

Figure 2:
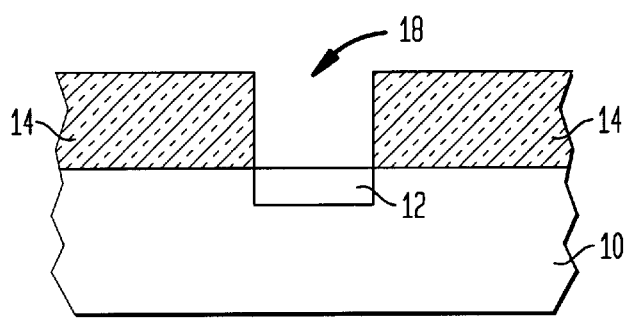

Next, an etch selective to silicon dioxide, is brought into contact with the photoresist layer 26 and into contact with the portion of the silicon dioxide layer 14 exposed by the window 18 to remove the exposed portions of the silicon dioxide layer 14 forming a via 20 through such silicon dioxide dielectric layer 14 as shown in FIG. 2. It is noted that the via exposes an underlying portion of the surface of the substrate 10, more particularly the via 20 exposes the doped region 12 in the substrate 10. The photoresist mask 16 (FIG. 1) is removed and the resulting structure is shown in FIG. 2.

Figure 3:
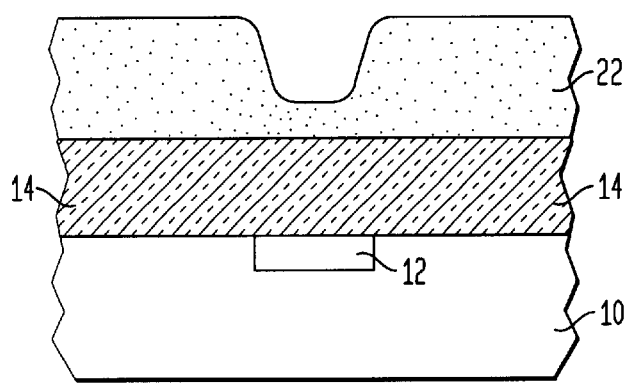
Figure 4:
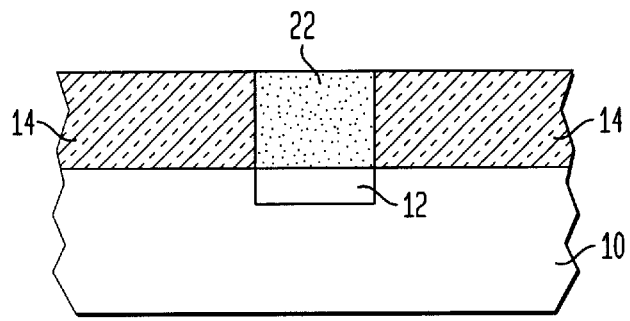

Next, referring also to FIG. 3, a layer 22 of an electrically conductive material, here doped polycrystalline silicon, is deposited over silicon dioxide dielectric layer 14 and through the via 20 (FIG. 2) onto the exposed portion of the substrate 10, more particularly onto the doped region 12. Next, the upper portions of the conductive material 22 are removed, for example by chemical mechanical polishing, to form an upper surface of such conductive material 22 co-planar with the upper surface of the silicon dioxide dielectric layer 14, as indicated in FIG. 4. It is noted that portions of such conductive material 22 passing through the via 22 (FIG. 2) from the upper surface of the silicon dioxide dielectric layer 14 to said exposed portion, i.e., the doped region 12, of substrate 10 provides a conductive plug 24 through the silicon dioxide dielectric layer 14, such plug 24 being in electrical contact with the doped region 12.

Figure 5:
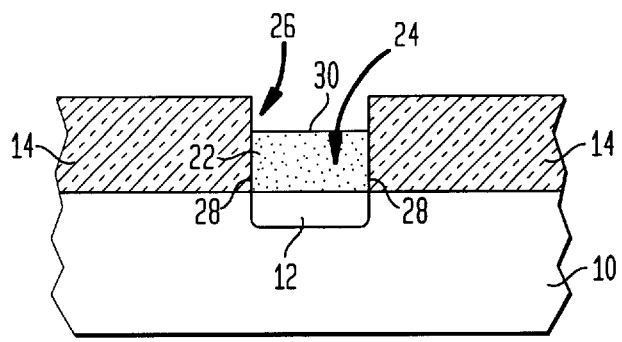

Next, an upper portion of the doped polycrystalline silicon conductive plug 24 is removed, here for example, using a reactive ion etch (RIE) selective to silicon to provide a recess 26 therein as shown in FIG. 5. It is noted that the recess 26 has portions of the silicon dioxide dielectric layer 14 providing sidewalls 28 of the recess 26 and has an upper surface 30 of the conductive plug 24 providing a bottom of the recess 26.

Figure 6:
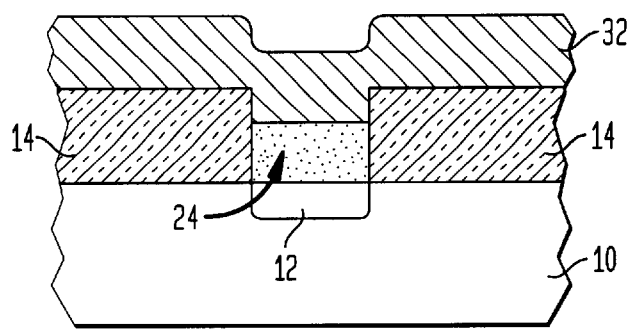

Next, and referring to FIG. 6, a barrier conductive layer 32 is deposited over the upper surface of the silicon dioxide dielectric layer 14 with portions of the barrier conductive layer 32 being disposed in the recess 26 (FIG. 5). The barrier conductive layer 32 is an electrically conductive material, for example titanium nitride, tantalum nitride or tantalum silicon nitride.

Figure 7:
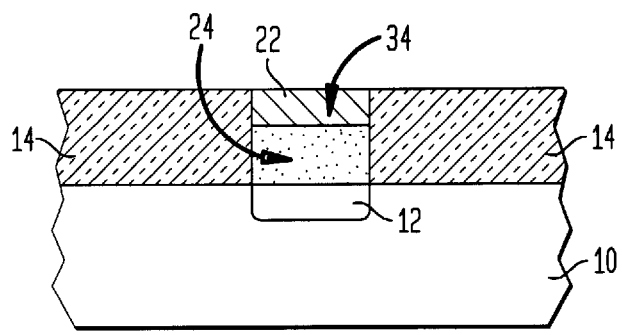

Next, upper portions of the barrier conductive layer 32 are removed as shown in FIG. 7 to form a barrier conductive contact 34 in the recess 26 (FIG. 5). It is noted that the barrier conductive contact 34 extends from the conductive plug 24 and terminates in a plane of the upper surface of the silicon dioxide layer 14.

Figure 8:
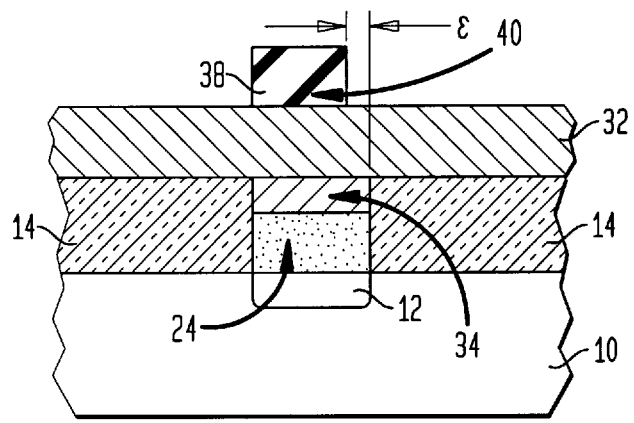

Next, referring to FIG. 8, an electrode layer 36, here sputter deposited platinum, is deposited over the silicon dioxide dielectric layer 14 and onto the barrier contact 34.

Next, a photoresist layer 38 is deposited over the electrode layer 36 and lithographically processed to provide a mask 40 on the electrode layer 36. More particularly, the mask 40 is nominally in registration with (i.e., disposed over and in alignment with) the barrier contact 34 and the underlying conductive plug 24. In a practical case, however, there will be some lateral displacement or misalignment. Here, in FIG. 8, there is shown a lateral misalignment of å.

Figure 9:
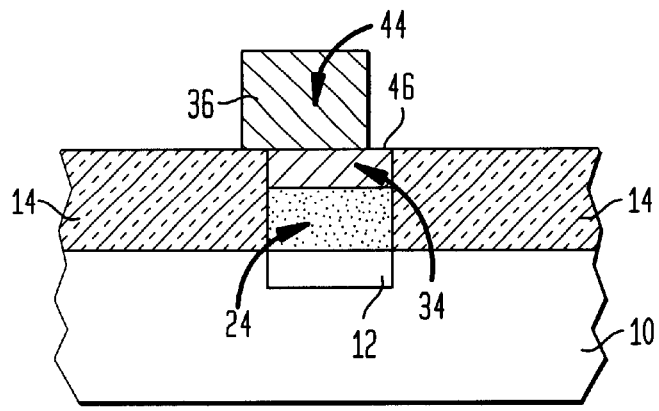

Using the mask 40, an etch is used to remove portions of the platinum electrode layer exposed by the mask 40 while leaving the portions of the electrode layer 32 under the mask 40 to provide an electrode 44 (FIG. 9) of a storage element being formed for the DRAM. It is noted in FIG. 9 that the misalignment of the mask 40 registration results in the electrode 44 exposing portions 46 of the barrier contact 34 as shown. Next the mask 40, FIG. 8 is removed and the resulting structure is shown in FIG. 9.

Figure 10:
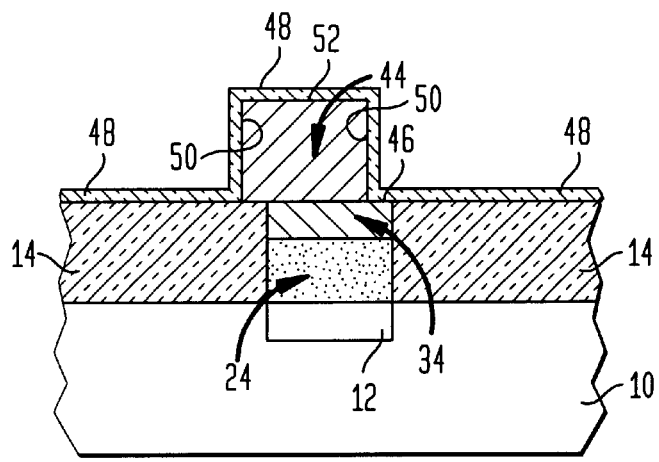

Next, referring to FIG. 10, a silicon nitride dielectric layer 48 is deposited over the silicon dioxide dielectric layer 14 and over side portions 50 and top portions 52 of the formed electrode 44 and over any exposed portions 46 of barrier contact 34, as shown.

Figure 11:
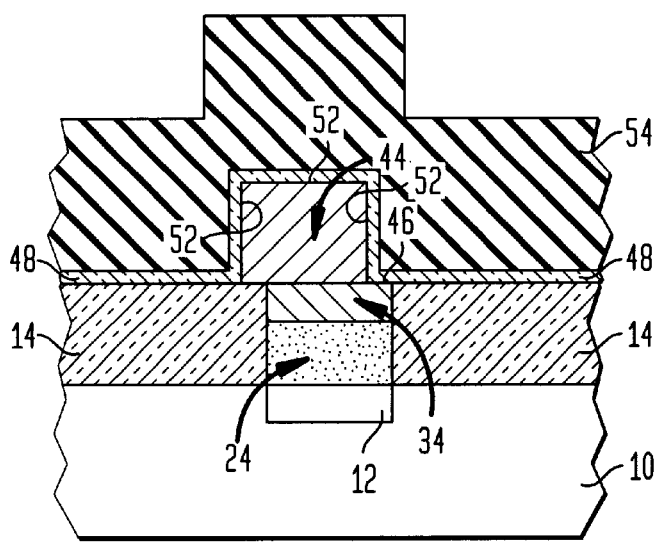

Next, referring to FIG. 11, a sacrificial material 54, here photoresist, is deposited, here spun, over the silicon nitride dielectric layer 48, as indicated. It is noted that the sacrificial material 54 extends above the top portions 52 of the formed electrode 44.

Figure 12:
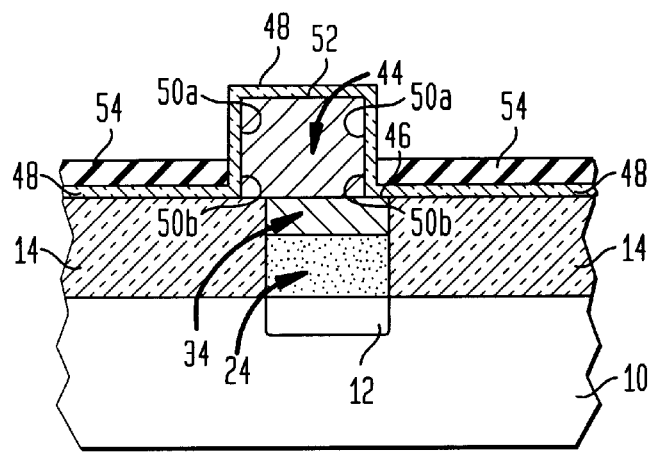

Next, referring also to FIG. 12, the upper portions of the sacrificial material 54 are removed, here using a Chemical Dry Etch (CDE) process, to expose portions of the silicon nitride dielectric layer 48 disposed on said top portions 52 of the formed electrode 44 and on upper portions 50a of said side portions 50 of the formed electrode 44 while leaving such sacrificial material 54 on the lower portions of the silicon nitride dielectric layer 48 which are disposed on: (a) lower portions 50b of the side portions 50 of the electrode 54; (B) portions of the silicon nitride dielectric layer 48 disposed on the silicon dioxide dielectric layer 14; and, (C) any portions of the silicon nitride dielectric layer 48 disposed on any of said exposed portions 46 of the barrier contact 34, as indicated in FIG. 12.

Figure 13:
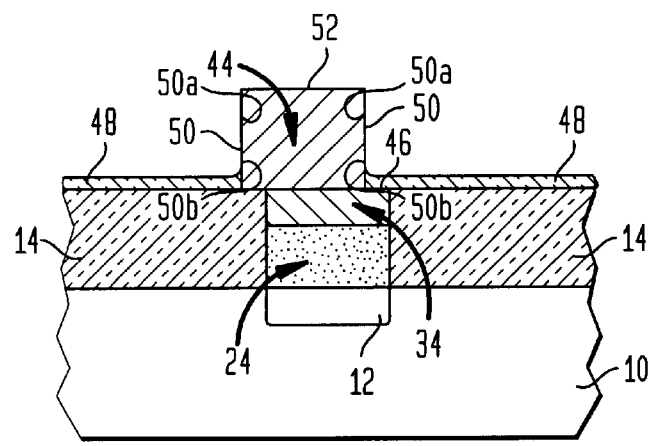

Referring now to FIG. 13, the exposed portions of the silicon nitride dielectric layer 48 shown in FIG. 12 are removed using either a Reactive Ion Etch (RIE) or wet etch while leaving the unexposed portions of the silicon nitride dielectric layer 48, i.e., leaving the portions of the silicon nitride dielectric layer 48 which are disposed on: (A) lower sides 50b of the electrode 44; (B) on the silicon dioxide dielectric layer 14; and, on any exposed portions 46 of the barrier contact 34.

Figure 14:
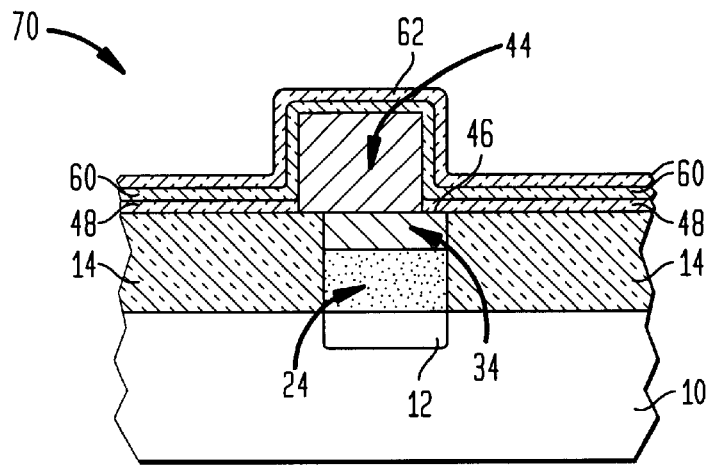

Referring now also to FIG. 14, a dielectric material 60, here, for example, BaSrTiO$_3$(BSTO), is deposited over the structure shown in FIG. 13. It is noted that portions of the silicon nitride dielectric layer 48 disposed on the exposed portions 46 of the barrier contact 34 protect such exposed portions 46 from the dielectric material. The structure is then subjected to a MOCVD or PVD process to form the dielectric material 60 and thereby provide the dielectric for the storage element of the DRAM, here such storage element being a capacitor. The MOCVD or PVD process takes place in an oxidizing environment; however, the process does not oxidize the barrier contact 34 because the exposed portions 46 of the barrier contact 34 are protected by the silicon nitride dielectric layer 48 from the dielectric material 60.

Next, a second electrode layer 62 is deposited over the dielectric material 60, as shown in FIG. 14, to provide the second electrode of the capacitor 70.

Other embodiments are within the spirit and scope of the invention. For example, while the material 69 described above is a dielectric material to provide a capacitor 70 for the DRAM cell described above, the material 60 may be a ferroelectric material as when an FRAM is cell is to be formed.

What is claimed is:

1. A method for forming an electrode, comprising:

forming a conductive plug through a first dielectric layer, such plug extending from an upper surface of the first dielectric layer to a contact region in a semiconductor substrate;

forming a barrier contact on an upper surface of the conductive plug;

forming the electrode on one portion of the upper surface of the barrier contact, another portion of the upper surface of the barrier contact being uncovered by the electrode;

depositing a second dielectric layer over the first dielectric layer, over side portions and top portions of the formed electrode, and over the uncovered portion of barrier contact;

providing a sacrificial material on portions of the second dielectric layer disposed on: lower sides of the electrode; portions of the second dielectric layer disposed on the first dielectric layer; and, said uncovered portions of the barrier contact while exposing portions of the second dielectric layer disposed on the top portions and upper side portions of the formed electrode; and removing the exposed portions of the second dielectric layer while leaving the portions of the second dielectric layer disposed on: lower sides of the electrode; portions of the second dielectric layer disposed on the first dielectric layer; and, portions of the second dielectric layer disposed on said uncovered portions of the barrier contact.

2. The method of claim 1 further comprising depositing a third dielectric layer over the second dielectric layer.

3. A method for forming a storage element, comprising:

forming a conductive plug through a first dielectric layer, such plug extending from an upper surface of the first dielectric layer to a contact region in a semiconductor substrate;

forming a barrier contact on an upper surface of the conductive plug;

forming a first electrode for the storage element on one portion of the upper surface of the barrier contact, another portion of the upper surface of the barrier contact being uncovered by the first electrode;

depositing a second dielectric layer over the first dielectric layer, over side portions and top portions of the formed first electrode, and over the uncovered portion of barrier contact;

providing a sacrificial material on portions of the second dielectric layer disposed on: lower sides of the first electrode; portions of the second dielectric layer disposed on the first dielectric layer; and, said uncovered portions of the barrier contact while exposing portions of the second dielectric layer disposed on the top portions and upper side portions of the formed first electrode; and removing the exposed portions of the second dielectric layer while leaving the portions of the second dielectric layer disposed on: lower sides of the first electrode; portions of the second dielectric layer disposed on the first dielectric layer; and, portions of the second dielectric layer disposed on said uncovered portions of the barrier contact;

depositing a material over exposed portions of the first electrode and over remaining portions of the second dielectric layer in an oxidizing environment;

forming a second electrode for the storage element over the material.

4. A method for forming an electrode, comprising:

forming a conductive plug through a first dielectric layer, such plug extending from an upper surface of the first dielectric layer to a contact region in a semiconductor substrate;

photolithographically forming the electrode, misalignment of a mask registration in the photolithography resulting in exposing surface portions of a barrier contact;

depositing a second dielectric layer over the first dielectric layer, over side portions and top portions of the formed electrode, and over exposed portions of the barrier contact;

providing a sacrificial material on portions of the second dielectric layer disposed on lower sides of the electrode, on portions of the second dielectric layer disposed on the first dielectric layer, and on said exposed portions of the barrier contact while exposing portions of the second dielectric layer on the top portions and upper side portions of the formed electrode; and removing the exposed portions of the second dielectric layer while leaving the portions of the second dielectric layer disposed on lower sides of the electrode, on portions of the second dielectric layer disposed on the first dielectric layer, and on portions of the second dielectric layer disposed on said exposed portions of the barrier contact.

5. The method of claim 4 further comprising depositing a third dielectric layer over the second dielectric layer.

6. A method for forming an electrode, comprising:

providing a semiconductor substrate;

forming a first dielectric layer on a surface of the substrate;

providing a mask over the first dielectric layer, such mask having a window over a selected portion of the surface of the substrate to expose an underlying portion of the first dielectric;

selectively removing the underlying portion of the dielectric layer to form a via through such first dielectric layer, such via exposing an underlying portion of the surface of the substrate;

removing the mask to expose the first dielectric layer and the via formed therein;

depositing an electrically conductive material over exposed first dielectric layer and through the via onto the exposed portion of the substrate;

removing upper portions of the conductive material forming an upper surface of such material co-planar with the surface of the first dielectric layer, portions of such conductive material passing through the via from the surface of the first dielectric layer to said exposed portion of substrate to provide a conductive plug through the first dielectric layer;

recessing an upper portion of the conductive plug to provide a recess, such recess having portions of the dielectric layer providing sidewalls of the recess and having an upper surface of the conductive plug providing a bottom of the recess;

forming a barrier conductive layer over the first dielectric layer with portions of the barrier conductive layer being disposed in the recess;

removing upper portions of the barrier conductive layer to form a barrier conductive contact in the recess, such contact extending from the conductive plug and terminating in a plane of the first dielectric layer;

depositing an electrode layer over the first dielectric layer and over the barrier conductive contact;

forming a mask over the electrode layer, such mask being nominally in registration with the barrier conductive contact;

removing unmasked portions of the electrode layer while leaving the portions of the electrode layer under the mask to provide the electrode, wherein misalignment of the mask registration results in exposing portions of the barrier conductive contact;

removing the mask;

depositing a second dielectric layer over the first dielectric layer and over side portions and top portions of the formed electrode and over any exposed portions of barrier conductive contact;

depositing a sacrificial material over the second dielectric layer, such sacrificial material extending above the top portions of the formed electrode;

removing upper portions of the sacrificial material to expose portions of the second dielectric layer disposed on said top portions of the formed electrode and on upper portions of said side portions of the formed electrode while leaving lower portions of the sacrificial material on portions of the second dielectric layer disposed on lower sides of the electrode, on portions of the second dielectric layer disposed on the first dielectric layer, and on any portions of the second dielectric layer disposed on any of said exposed portions of the barrier conductive contact; and removing the exposed portions of the second dielectric layer while leaving the portions of the second dielectric layer disposed on lower sides of the electrode, on portions of the second dielectric layer disposed on the first dielectric layer, and on any portions of the second dielectric layer disposed on any of said exposed portions of the barrier conductive contact.

7. The method of claim 6 further comprising depositing a third dielectric layer over the second dielectric layer.

* * * * *